(12) United States Patent
Schaefer et al.

(10) Patent No.: US 11,307,061 B2
(45) Date of Patent: Apr. 19, 2022

(54) ELECTRICAL MEASUREMENT DEVICE

(71) Applicant: Rohde & Schwarz GmbH & Co. KG, Munich (DE)

(72) Inventors: Andrew Schaefer, Oberhaching (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 168 days.

(21) Appl. No.: 15/916,022

(22) Filed: Mar. 8, 2018

(65) Prior Publication Data

US 2019/0277670 A1 Sep. 12, 2019

(51) Int. Cl.
*G01D 7/12* (2006.01)
*G01R 13/20* (2006.01)
*G01R 1/02* (2006.01)
*H04R 3/00* (2006.01)

(52) U.S. Cl.
CPC ............... *G01D 7/12* (2013.01); *G01R 1/025* (2013.01); *H04R 3/00* (2013.01); *G01R 13/20* (2013.01)

(58) Field of Classification Search
None
See application file for complete search history.

(56) References Cited

U.S. PATENT DOCUMENTS

| | | | | |
|---|---|---|---|---|
| 5,020,108 | A | * | 5/1991 | Wason ..................... G01D 7/12 342/28 |
| 6,094,624 | A | * | 7/2000 | Chao .................. G01R 31/3181 324/500 |
| 2006/0055709 | A1 | * | 3/2006 | Robinson ............... G01R 1/025 345/626 |
| 2008/0144839 | A1 | * | 6/2008 | Yoshino ................... G01H 3/12 381/56 |
| 2011/0246134 | A1 | | 10/2011 | Frishberg et al. |
| 2016/0255448 | A1 | * | 9/2016 | Morant .................. H04R 25/30 381/314 |
| 2017/0227581 | A1 | * | 8/2017 | Knierim ............. G01R 13/0245 |

* cited by examiner

*Primary Examiner* — Nasima Monsur
(74) *Attorney, Agent, or Firm* — Christensen O'Connor Johnson Kindness PLLC

(57) ABSTRACT

An electrical measurement device for measuring at least one electrical signal is described, the electrical measurement device comprising an electrical measurement unit for measuring the electrical signal and for deriving at least one measurement parameter from the measured electrical signal, an acoustic processing unit for processing a signal obtained from the electrical measurement unit, and a loudspeaker for outputting an acoustic signal representative of the signal obtained from the electrical measurement unit. The acoustic processing unit is configured to generate the acoustic signal to be outputted by the loudspeaker. The acoustic processing unit is further configured to modulate a predetermined acoustic signal by the at least one measurement parameter.

15 Claims, 3 Drawing Sheets

ELECTRICAL MEASUREMENT DEVICE

TECHNICAL FIELD

Embodiments of the present disclosure relate to an electrical measurement device, for instance an oscilloscope.

BACKGROUND

Electrical measurement devices for measuring at least one electrical signal such as oscilloscopes are known in the state of the art wherein a respective measurement parameter being of interest is displayed on a display of the electrical measurement device for informing the user of the electrical measurement device appropriately. Thus, the respective information is only displayed on the electrical measurement device so that the user has to look on the display for retrieving the respective information.

However, the user of the electrical measurement device might have to probe a device under test for obtaining the electrical signal to be measured, in particular to gather the information assigned to the measurement parameter. Accordingly, it is disadvantageous for the user to look on the display for obtaining the respective information while probing the device under test simultaneously.

It is known that certain oscilloscopes may output a beep, namely a binary acoustic signal, in case of an occurring trigger event in order to inform the user that he can retrieve a certain information on the display of the electrical measurement device.

Those oscilloscopes ensure that the user is informed when a certain trigger event occurs. Hence, the time can be reduced the user is looking on the display while awaiting the respective information regarding the measurement parameter. Nevertheless, the user still has to look on the display of the electrical measurement device for obtaining the respective information related to the trigger event at least for a short time.

SUMMARY

Accordingly, there is a need for an electrical measurement device that provides the information in a more convenient manner.

To address this need and/or others, embodiments of the present disclosure relate to an electrical measurement device. The electrical measurement device comprises an electrical measurement unit for measuring the electrical signal and for deriving at least one measurement parameter from the measured electrical signal, an acoustic processing unit for processing a signal obtained from the electrical measurement unit, and a loudspeaker for outputting an acoustic signal representative of the signal obtained from the electrical measurement unit. The acoustic processing unit is configured to generate the acoustic signal to be outputted by the loudspeaker, the acoustic processing unit being further configured to modulate a predetermined acoustic signal by the at least one measurement parameter.

Accordingly, the user of the electrical measurement device does not have to look on a display of the electrical measurement device for obtaining the respective information as this information is outputted in an acoustic manner. The acoustic signal being representative of the signal obtained from the electrical measurement unit, namely the at least one measurement parameter, is a complex acoustic signal as it contains the respective information regarding the measurement parameter, in particular its magnitude or its value. Hence, a simple beep would not be sufficient as a beep cannot contain any information.

A predetermined acoustic signal may be provided which is modulated depending on the at least one measurement parameter, in particular its value. This means that the modulation may be higher for a higher value of the respective measurement parameter compared to the modulation for a lower value measured by the electrical measurement unit. Thus, the user may obtain the information regarding the value of the measurement parameter due to the respective modulation.

Further, embodiments of the present disclosure relate to an electrical measurement device for measuring at least one electrical signal. The electrical measurement device comprises an electrical measurement unit for measuring the electrical signal and for deriving at least one measurement parameter from the measured electrical signal, an acoustic processing unit for processing a signal obtained from the electrical measurement unit, and a loudspeaker for outputting an acoustic signal representative of the signal obtained from the electrical measurement unit. The acoustic processing unit is configured to receive at least one measurement parameter from the electrical measurement unit, the at least one measurement parameter is at least one of a mask violation, a trigger frequency, a severity of a threshold crossing, the frequency of the electrical signal, and the amplitude of the electrical signal.

Accordingly, the acoustic processing unit is configured to provide an acoustic signal for the measurement parameter being at least one of a mask violation, a trigger frequency, a severity of a threshold crossing, the frequency of the electrical signal, and the amplitude of the electrical signal. This means that the electrical measurement device may output an acoustic signal when the electrical signal is measured with regard to mask violation, trigger frequency, severity of a threshold crossing, the frequency of the electrical signal or the amplitude of the electrical signal.

The mask relates to a two-dimensional manifold (sometimes called "eye") in a plane representing characteristics of the signal(s), for instance amplitude versus time or rather amplitude versus phase. The mask may have any shape, e.g. the shape of a slotted rectangle, a slotted ellipse or an annulus. However, deformations of these shapes are also possible. Accordingly, the mask violation occurs when a signal, in particular a portion thereof, intersects the two-dimensional manifold.

The trigger frequency relates to the statistical frequency of triggering, namely how often the same trigger event occurs in a certain time. Accordingly, statistical information regarding the electrical signal can be outputted in an acoustic manner for informing the user.

The severity of a threshold crossing indicates by which amount the signal or at least a portion thereof may exceed or rather fall below a threshold. The threshold may relate to the amplitude, the frequency, the phase or any other suitable characteristic of the electrical signal.

According to an aspect, at least one of the amplitude, the frequency, and the phase of the predetermined acoustic signal is modulated by the at least one measurement parameter derived from the measured electrical signal by the electrical measurement unit. Hence, the sound level or rather volume (amplitude modulation) and/or the ton pitch (frequency modulation) may be varied depending on the at least one measurement parameter. Hence, the information assigned to the at least one measurement parameter can be recognized acoustically.

Alternatively or additionally to these modulations, a phase modulation may also take place for modulating the predetermined acoustic signal. The more modulation parameters, the more information can be provided by the acoustic signal.

Another aspect provides that at least one of the amplitude, the frequency, and the phase of the predetermined acoustic signal is modulated by two different measurement parameters derived from the measured electrical signal by the electrical measurement unit. Hence, two or more of the characteristics of the acoustic signal may be adapted depending on at least two different measurement parameters. Thus, more information can be outputted simultaneously. For instance, a first measurement parameter is used for modulating the amplitude of the acoustic signal, for example the predetermined acoustic signal, whereas a second measurement parameter is used for modulating the respective frequency.

For instance, at least one of the amplitude, the frequency, and the phase of the predetermined acoustic signal is modulated by three different measurement parameters derived from the measured electrical signal by the electrical measurement unit. The information content can be increased further.

According to an embodiment, at least one carrier tone of the predetermined acoustic signal is modulated. The acoustic signal may have one carrier tone that is modulated appropriately, for example its amplitude, its frequency, and its phase.

Furthermore, a plurality of carrier tones of the predetermined acoustic signal may be modulated. The acoustic signal may be a more complex one as it comprises a plurality of carrier tones which may be modulated individually. Accordingly, the amount of information provided by the acoustic signal can be increased.

In some embodiments, each carrier tone is modulated by a different source. Hence, several signal sources can be processed simultaneously wherein each signal source may relate to a dedicated carrier tone of the acoustic signal so that an unambiguous allocation can be ensured.

For instance, the at least one measurement parameter relates to at least one of amplitude, time, a parameter of an eye diagram, spectrum, jitter, histogram, and a parameter concerning serial bus analysis. The information assigned to these different measurement parameters can be outputted acoustically in a simple manner.

In some embodiments, the at least one measurement parameter relates to at least one of the following:

a mask violation, a trigger frequency, a severity of a threshold crossing, the frequency of the electrical signal, the amplitude of the electrical signal, a magnitude of threshold violation, a magnitude of mask violation, a number of mask violations, an acquired waveform, a tracking waveform, a histogram, a maximum of amplitude, a minimum of amplitude, a local high of amplitude, a local low of amplitude, peak to peak of amplitudes, a mean value of amplitudes, a root mean square of amplitudes, a standard deviation of amplitudes, an overshoot, an area, a rise time, a fall time, a positive width, a negative width, a period, a delay, a burst width, a pulse count, a positive switching, a negative switching, a cycle area, a cycle mean, a cycle root mean square, a cycle standard deviation, a hold time, a hold ration, a pulse train, a slew rate rising, a slew rate falling, an excitation ratio, an eye height, an eye width, an eye top, an eye base, a Q factor, a signal to noise ratio, a duty cycle distortion, an eye rise time, an eye fall time, an eye bit rate, an eye amplitude, a jitter, a channel power, a bandwidth, an occupied bandwidth, a harmonic search, a total harmonic distortion, total harmonic distortion variants, overall voltage, overall voltage root mean square, a peak list, a cycle-to-cycle jitter, a N-cycle jitter, a cycle-to-cycle width, a cycle-to-cycle duty cycle, a time-interval error, a data rate, a unit interval, a skew delay, a skew phase, waveform count, waveform samples, histogram samples, histogram peak, peak value, maximum of histogram, minimum of histogram, median of histogram, range of histogram, range of histogram, mean of histogram, root mean square of histogram and statistical frequency of data packets.

Information regarding one of these measurement parameters, a group of these measurement parameters or rather all measurement parameters can be outputted acoustically.

This means that the electrical measurement unit is configured to measure the electrical signal with regard to at least one of the above mentioned so that the respective measurement parameter can be derived from the electrical signal.

In addition, the acoustic processing unit is configured to process the respective signal obtained from the electrical measurement unit in order to generate the acoustic signal based on the signal obtained from the electrical measurement unit, namely the respective measurement parameter.

According to an aspect, the acoustic processing unit is configured to modulate a predetermined acoustic signal by the at least one measurement parameter. As mentioned above, a predetermined acoustic signal may be provided which is modulated depending on the at least one measurement parameter, in particular its value or rather its magnitude. This means that the modulation may be higher for a higher value of the respective measurement parameter compared to the modulation for a lower value. Thus, the user may hear this information due to the respective modulation level of the acoustic signal.

As already indicated above, the acoustic signal may be a non-binary acoustic signal. Hence, more information can be provided in an acoustic manner as the hearing ability of a human ear is used in its entirety.

Moreover, embodiments of the present disclosure further relate to an electrical measurement device for measuring at least one electrical signal. The electrical measurement device comprises an electrical measurement unit for measuring the electrical signal and for deriving at least one measurement parameter from the measured electrical signal, an acoustic processing unit for processing a signal obtained from the electrical measurement unit; and a loudspeaker for outputting an acoustic signal representative of the signal obtained from the electrical measurement unit.

The acoustic processing unit is configured to receive at least one of the following measurement parameters from the electrical measurement unit for generating the acoustic signal:

a mask violation, a trigger frequency, a severity of a threshold crossing, the frequency of the electrical signal, the amplitude of the electrical signal, a magnitude of threshold violation, a magnitude of mask violation, a number of mask violations, an acquired waveform, a tracking waveform, a histogram, a maximum of amplitude, a minimum of amplitude, a local high of amplitude, a local low of amplitude, peak to peak of amplitudes, a mean value of amplitudes, a root mean square of amplitudes, a standard deviation of amplitudes, an overshoot, an area, a rise time, a fall time, a positive width, a negative width, a period, a delay, a burst width, a pulse count, a positive switching, a negative switching, a cycle area, a cycle mean, a cycle root mean square, a cycle standard deviation, a hold time, a hold ration, a pulse train, a slew rate rising, a slew rate falling, an excitation ratio, an eye height, an eye width, an eye top, an eye base, a Q factor, a signal to noise ratio, a duty cycle distortion, an eye rise time, an eye fall time, an eye bit rate, an eye amplitude, a jitter, a channel power, a bandwidth, an occupied bandwidth, a harmonic search, a total harmonic distortion, total harmonic distortion variants, overall voltage, overall voltage root mean square, a peak list, a cycle-to-cycle jitter, a N-cycle jitter, a cycle-to-cycle width, a cycle-to-cycle duty cycle, a time-interval error, a data rate, a unit interval, a skew delay, a skew phase, waveform count, waveform samples, histogram samples, histogram peak, peak value, maximum of histogram, minimum of histogram, median of histogram, range of histogram, range of histogram, mean of histogram, root mean square of histogram and statistical frequency of data packets.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
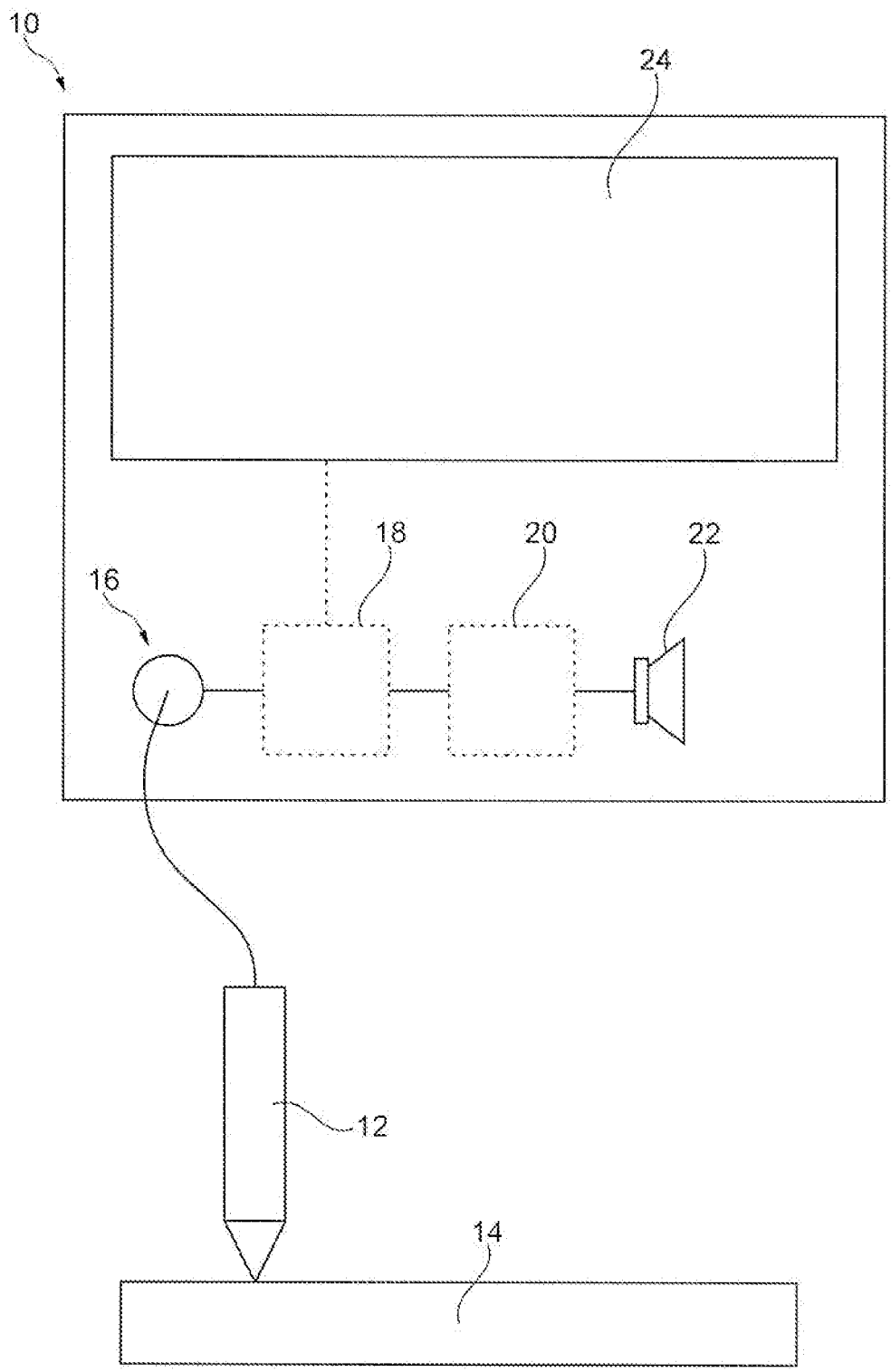
FIG. 1 schematically shows an electrical measurement device according to an embodiment of the present disclosure.

In FIG. 1, an electrical measurement device 10 for measuring at least one electrical signal is shown that is established by an oscilloscope in the shown embodiment. Therefore, the electrical measurement device 10 is connected with a probe 12 for probing a device under test 14 in order to retrieve the electrical signal being of interest.

The electrical measurement device 10 comprises an interface 16 with which the probe 12 is connected so that the probed signal can be forwarded to internal components of the electrical measurement device 10 for further processing. The electrical signal probed is forwarded internally to an electrical measurement unit 18 that is configured to measure the electrical signal and to derive at least one measurement parameter from the measured electrical signal as will be described later with reference to FIG. 2. In some embodiments, to carry out its functionality, the electrical measurement unit 18 can be implemented in hardware, such as analog circuitry, digital circuitry, or combinations thereof, or software, or a combination of hardware and software.

The electrical measurement unit 18 is connected to an acoustic processing unit 20 that is configured to process a signal obtained from the electrical measurement unit 18. The signal obtained from the electrical measurement unit 18 may relate to the at least one measurement parameter derived from the electrical signal measured. Hence, certain information regarding the at least one measurement parameter is forwarded to the acoustic processing unit 20.

In addition, the acoustic processing unit 20 is configured to generate an acoustic signal depending on the at least one measurement parameter. Thus, the acoustic processing unit 20 processes the signal obtained from the electrical measurement unit 18 such that an acoustic signal is generated being representative of the signal obtained which in turn is representative of the electrical signal measured.

In some embodiments, to carry out its functionality, the acoustic processing unit 20 can be implemented in hardware, such as analog circuitry, digital circuitry, or combinations thereof, or software, or a combination of hardware and software. In some embodiments, the acoustic processing unit 20 includes one or more programmed computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

Once the acoustic signal is generated by the acoustic processing unit 20, it is forwarded to a loudspeaker 22 so that the acoustic signal can be outputted via the loudspeaker 22.

Thus, the user of the electrical measurement device 10 obtains information regarding the at least one measurement parameter in an acoustic manner so that it is not necessary for the user to look on a display 24 of the electrical measurement device 10 for obtaining the respective information.

In some embodiments, the respective information regarding the at least one measurement parameter is outputted as a non-binary acoustic signal (complex acoustic signal) depending on the at least one measurement parameter. Hence, the acoustic signal generated differs from a simple beep tone.

As indicated in FIG. 1, the electrical measurement unit 18 may also be connected to the display 24 so that the respective information can be displayed simultaneously. Hence, the information regarding the at least one measurement parameter can be provided in an acoustic manner (via the loudspeaker 22) and in a visual manner (via the display 24) simultaneously.

When generating the acoustic signal, the acoustic processing unit 20 may use a predetermined acoustic signal that is modulated by the at least one measurement parameter. This means that the at least one measurement parameter, for example a characteristic of the at least one measurement parameter such as its value or its magnitude, is used for modulating the predetermined acoustic signal in a certain manner.

For this purpose, the acoustic processing unit 20 may comprise a data storage in which at least one predetermined acoustic signal is stored. The acoustic processing unit 20 accesses the data storage in order to load the at least one predetermined acoustic signal and to modulate the predetermined acoustic signal appropriately.

Furthermore, several predetermined acoustic signals may be provided, in particular stored in the data storage, wherein a certain predetermined acoustic signal is used for an associated measurement parameter or at least a group of measurement parameters. Thus, it is possible that each measurement parameter (or at least each group of measurement parameters) has an individual predetermined acoustic signal which is modulated depending on the respective measurement parameter, for instance its value or its magnitude, as will be described later with reference to FIG. 2.

Generally, the amplitude, the frequency and/or the phase of the predetermined acoustic signal can be modulated by the at least one measurement parameter. Thus, three different characteristics of the predetermined acoustic signal may be varied depending on the at least one measurement parameter resulting in an acoustic signal being distinctive. Moreover, more than one measurement parameter can be used simultaneously for modulating the predetermined acoustic signal, for instance two measurement parameters or three measurement parameters.

In addition, the acoustic signal generated may comprise at least one carrier tone that is modulated appropriately, for example, in the way mentioned above. Furthermore, the acoustic signal generated may comprise two or more carrier tones which can be modulated individually and independently from each other. Thus, a complex acoustic signal is provided which is varied so that the respective information can be provided acoustically.

For instance, each of the carrier tones is modulated by a different signal source. Hence, it is possible that more than one signal source is measured by the electrical measurement device 10 simultaneously. Accordingly, two or more electrical signals are processed simultaneously. The respective measurement parameters obtained can be used to modulate the corresponding carrier tones of the acoustic signal generated.

The measurement parameters derived from the measured electrical signal(s) by the electrical measurement unit 18 may relate to at least one of amplitude, time, eye diagram, spectrum, jitter, histogram, and parameters concerning serial bus analysis. Hence, information of different kinds of measurement parameters may be outputted in an acoustic manner. Hence, different groups of measurement parameters can be provided as indicated above.

In some embodiments, the electrical measurement unit 18 is configured to receive at least one of the following measurement parameters in order to generate the acoustic signal: a mask violation, a trigger frequency, a severity of a threshold crossing, the frequency of the electrical signal, and the amplitude of the electrical signal.

As already mentioned, the electrical measurement unit 18 may generally be configured to receive at least one measurement parameter concerning the amplitude of the electrical signal such as a maximum of amplitude, a minimum of amplitude, a local high of amplitude, a local low of amplitude, peak to peak of amplitudes, a mean value of amplitudes, a root mean square of amplitudes, a standard deviation of amplitudes, an overshoot and/or an area.

Further, the electrical measurement unit 18 may generally be configured to receive at least one measurement parameter concerning the time of the electrical signal such as a rise time, a fall time, a positive width, a negative width, a period, a delay, a burst width, a pulse count, a positive switching, a negative switching, a cycle area, a cycle mean, a cycle root mean square, a cycle standard deviation, a hold time, a hold ration, a pulse train, a slew rate rising and/or a slew rate falling.

In addition, the electrical measurement unit 18 may generally be configured to receive at least one measurement parameter concerning an eye diagram related to the electrical signal such as an excitation ratio, an eye height, an eye width, an eye top, an eye base, a Q factor, a signal to noise ratio, a duty cycle distortion, an eye rise time, an eye fall time, an eye bit rate, an eye amplitude and/or a jitter.

Moreover, the electrical measurement unit 18 may generally be configured to receive at least one measurement parameter concerning the spectrum of the electrical signal such as a channel power, a bandwidth, an occupied bandwidth, a harmonic search, a total harmonic distortion, total harmonic distortion variants, overall voltage, overall voltage root mean square and/or a peak list.

Furthermore, the electrical measurement unit 18 may generally be configured to receive at least one measurement parameter concerning jitter of the electrical signal such as a cycle-to-cycle jitter, a N-cycle jitter, a cycle-to-cycle width, a cycle-to-cycle duty cycle, a time-interval error, a data rate, a unit interval, a skew delay and/or a skew phase.

In addition, the electrical measurement unit 18 may generally be configured to receive at least one measurement parameter concerning a histogram of the electrical signal such as waveform count, waveform samples, histogram samples, histogram peak, peak value, maximum of histogram, minimum of histogram, median of histogram, range of histogram, range of histogram, mean of histogram and/or root mean square of histogram.

Moreover, the electrical measurement unit 18 may generally be configured to receive at least one measurement parameter concerning a mask violation, a trigger frequency, a severity of a threshold crossing, the frequency of the electrical signal, the amplitude of the electrical signal, a magnitude of threshold violation, a magnitude of mask violation, a number of mask violations, an acquired waveform, a tracking waveform, a histogram and/or statistical frequency of data packets.

Generally, the electrical measurement device 10, for example, the acoustic processing unit 20, may be configured to generate the acoustic signal based on at least one of the above mentioned measurement parameters and/or based on groups of the above mentioned measurement parameters. For generating the acoustic signal, the acoustic processing unit 20 may also use a random signal for indicating the respective information relating to the at least one measurement parameter.

Figure 2:
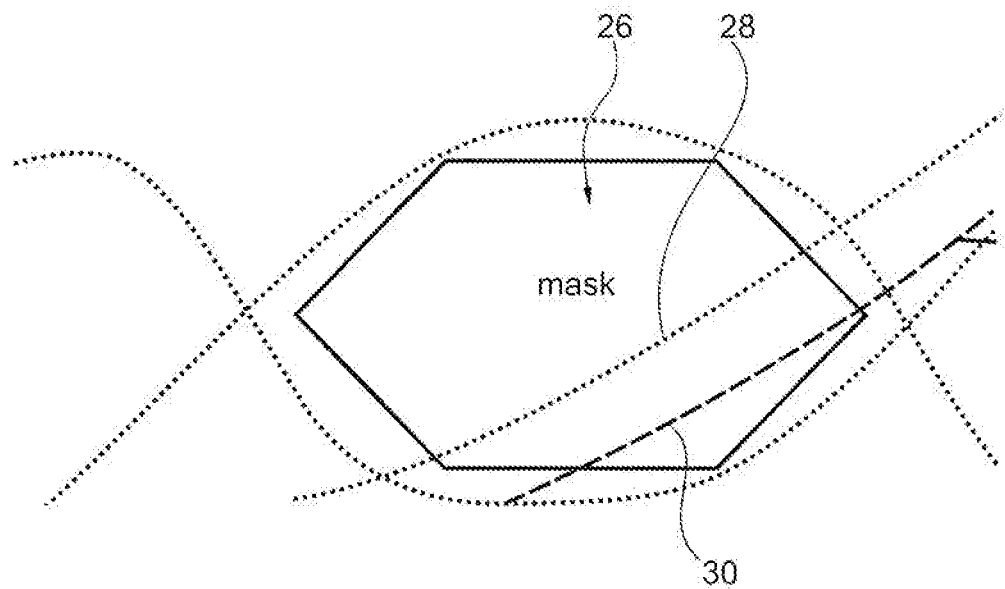
FIG. 2 shows an overview representing an illustration of signals and a measurement parameter on a display of the electrical measurement device as well as a diagram illustrating respective acoustic signals.
Figure 2:
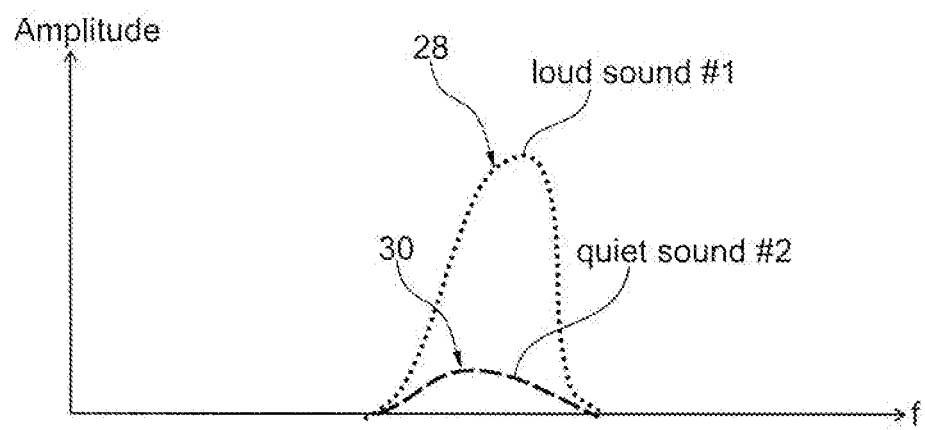

In FIG. 2, an overview is shown that represents a mask violation as the measurement parameter. In the upper part of FIG. 2, several electrical signals measured are illustrated which define a so-called eye. In addition, a mask 26 is shown being assigned to the eye. This illustration corresponds to an illustration that may be displayed on the display 24 of the electrical measurement device 10. It becomes obvious that the mask 26 provided is violated by two different electrical signals 28, 30 differently.

In the lower part of FIG. 2, representations of the acoustic signals are shown relating to the electrical signals 28, 30 that violate the mask 26. Since the first electrical signal measured 28 crosses (or: violates) the mask 26 more intensively than the second electrical signal measured 30, the acoustic signal is different. Accordingly, the information regarding the severity of violation is outputted in an acoustic manner appropriately, for instance by the volume of the signal as indicated in the lower part of FIG. 2.

In this embodiment, the acoustic signal generated relating to the first electrical signal 28 has a higher amplitude (being louder) than the acoustic signal generated relating to the second electrical signal 30. Hence, the user of the electrical measurement device 10 can easily recognize the severity of the mask violation (measurement parameter).

For instance, the acoustic signals were generated by the acoustic processing unit 20 while modulating a predetermined acoustic signal by the at least one measurement parameter (mask violation), in particular its value. Hence, the modulation for the acoustic signal relating to the first electrical signal 28 is stronger than the one for the second electrical signal 30.

In a similar manner, an acoustic signal can be generated by the acoustic processing unit 20 for the trigger frequency (statistical frequency of the occurrence of a trigger event), the severity of a threshold crossing (in a similar manner than the mask violation), the frequency of the electrical signal measured and/or the amplitude of the electrical signal measured.

This information can be provided acoustically in an easy manner so that the user is enabled to receive the information without looking on the display 24 of the electrical measurement device 10.

Moreover, the frequency may be modulated instead of the amplitude or rather the phase of the acoustic signal.

Figure 3:
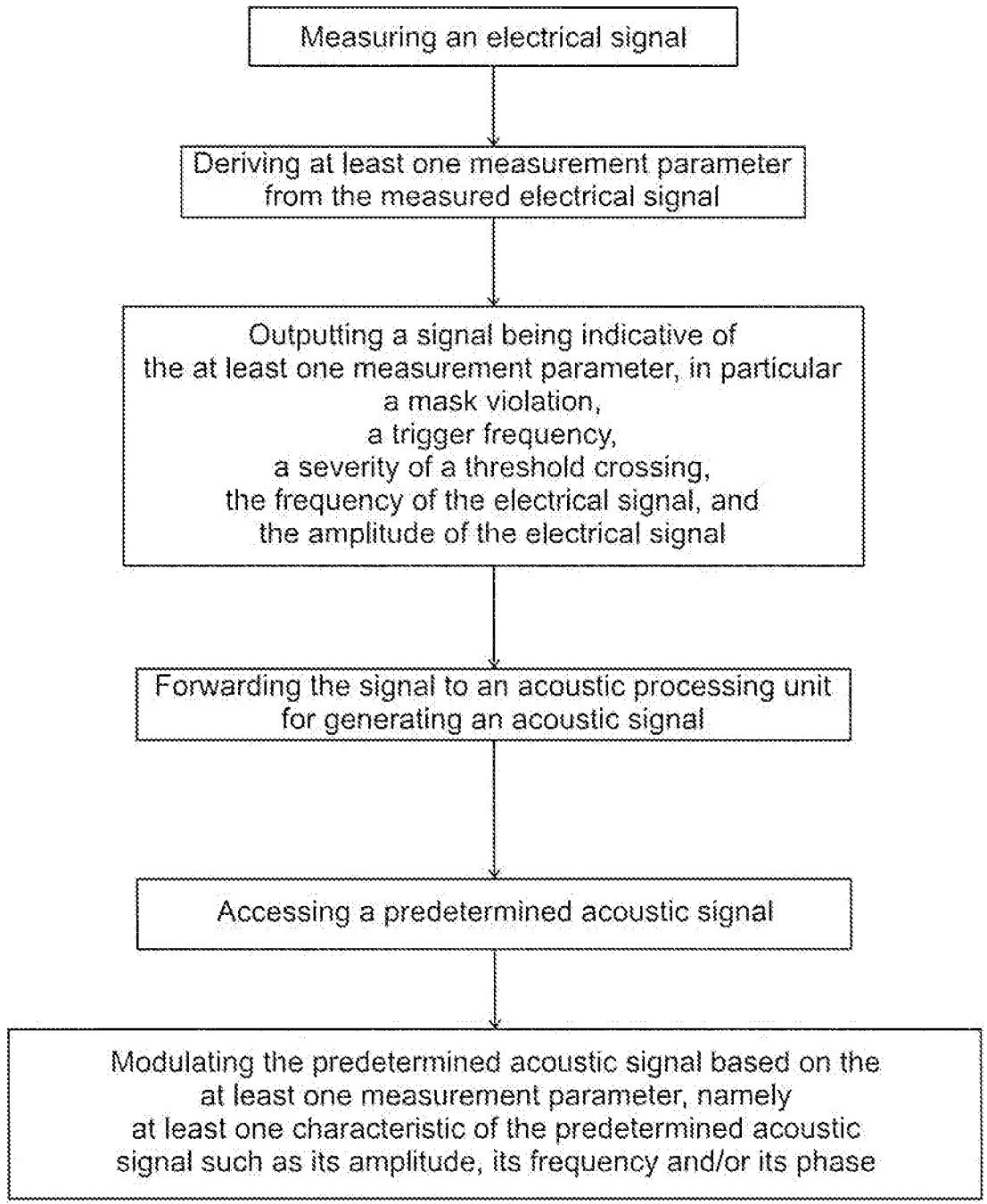
FIG. 3 shows a flow-chart illustrating a method for outputting an acoustic signal based on a measurement parameter.

These different aspects are summarized in the flow-chart of FIG. 3 illustrating a method for outputting an acoustic signal based on a measurement parameter according to the present disclosure. First, an electrical signal is measured by the electrical measurement device 10, for instance probed via the probe 12. The respective electrical signal is measured by the electrical measurement unit 18 so that at least one measurement parameter is derived from the measured electrical signal, for instance a mask violation, a trigger frequency, a severity of a threshold crossing, the frequency of the electrical signal, and the amplitude of the electrical signal.

Hence, the electrical measurement unit 18 outputs a signal being indicative of the at least one measurement parameter wherein this signal is forwarded to the acoustic processing unit 20 for generating an acoustic signal.

The acoustic processing unit 20 processes the signal obtained from the electrical measurement unit 18, for example the at least one measurement parameter, and may access a storage in which a predetermined acoustic signal is stored. In dependency of the signal obtained from the electrical measurement unit 18, for example the at least one measurement parameter, the predetermined acoustic signal is modulated, namely at least one characteristic of the predetermined acoustic signal such as its amplitude, its frequency and/or its phase. This modulated predetermined acoustic signal (acoustic signal generated) is forwarded to the loudspeaker 22 so that it is outputted by the loudspeaker 22.

The user of the electrical measurement device 10 is therefore enabled to obtain the respective information in an acoustic manner.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An oscilloscope, comprising:
    an interface with which a probe for probing a device under test is connected in order to retrieve an electrical signal;
    an electrical measurement circuit configured to measure the electrical signal received from the probe and for deriving at least one measurement parameter from the measured electrical signal;
    an acoustic processing circuit configured to process a signal obtained from the electrical measurement circuit; and
    wherein the electrical measurement circuit is connected to the acoustic processing circuit;
    a loudspeaker for outputting an acoustic signal representative of the signal obtained from the electrical measurement circuit,
    wherein the acoustic processing circuit is configured to generate the acoustic signal to be outputted by the loudspeaker, the acoustic processing circuit being further configured to modulate a predetermined acoustic signal by the at least one measurement parameter,
    wherein the acoustic processing circuit is configured to modulate at least one of amplitude, frequency, or phase of the predetermined acoustic signal by the at least one measurement parameter derived from the measured electrical signal by the electrical measurement circuit,
    wherein the modulated predetermined acoustic signal is outputted by the loudspeaker;
    wherein the interface, the electrical measurement circuit, and the acoustic processing circuit are each housed within the oscilloscope.

2. The oscilloscope according to claim 1, wherein at least one of the amplitude, the frequency, or the phase of the predetermined acoustic signal is modulated by two different measurement parameters derived from the measured electrical signal by the electrical measurement circuit.

3. The oscilloscope according to claim 2, wherein at least one carrier tone of the predetermined acoustic signal is modulated.

4. The oscilloscope according to claim 2, wherein a plurality of carrier tones of the predetermined acoustic signal are modulated.

5. The oscilloscope according to claim 4, wherein each carrier tone is modulated by a different source.

6. The oscilloscope according to claim 2, wherein the at least one measurement parameter relates to at least one of amplitude, time, a parameter of an eye diagram, spectrum, jitter, histogram, or a parameter concerning serial bus analysis.

7. The oscilloscope according to claim 2, wherein the at least one measurement parameter relates to at least one of the following:
    a mask violation, a trigger frequency, a severity of a threshold crossing, the frequency of the electrical signal, the amplitude of the electrical signal, a magnitude of threshold violation, a magnitude of mask violation, a number of mask violations, an acquired waveform, a tracking waveform, a histogram, a maximum of amplitude, a minimum of amplitude, a local high of amplitude, a local low of amplitude, peak to peak of amplitudes, a mean value of amplitudes, a root mean square of amplitudes, a standard deviation of amplitudes, an overshoot, an area, a rise time, a fall time, a positive width, a negative width, a period, a delay, a burst width, a pulse count, a positive switching, a negative switching, a cycle area, a cycle mean, a cycle root mean square, a cycle standard deviation, a hold time, a hold ration, a pulse train, a slew rate rising, a slew rate falling, an excitation ratio, an eye height, an eye width, an eye top, an eye base, a Q factor, a signal to noise ratio, a duty cycle distortion, an eye rise time, an eye fall time, an eye bit rate, an eye amplitude, a jitter, a channel power, a bandwidth, an occupied bandwidth, a harmonic search, a total harmonic distortion, total harmonic distortion variants, overall voltage, overall voltage root mean square, a peak list, a cycle-to-cycle jitter, a N-cycle jitter, a cycle-to-cycle width, a cycle-to-cycle duty cycle, a time-interval error, a data rate, a unit interval, a skew delay, a skew phase, waveform count, waveform samples, histogram samples, histogram peak, peak value, maximum of histogram, minimum of histogram, median of histogram, range of histogram, range of histogram, mean of histogram, root mean square of histogram or statistical frequency of data packets.

8. The oscilloscope according to claim 2, wherein the acoustic signal is a non-binary acoustic signal.

9. An oscilloscope, comprising:
an interface with which a probe for probing a device under test is connected in order to retrieve an electrical signal;
an electrical measurement circuit for measuring the electrical signal received from the probe and for deriving at least one measurement parameter from the measured electrical signal;
an acoustic processing circuit for processing a signal obtained from the electrical measurement circuit; and
wherein the electrical measurement circuit is connected to the acoustic processing circuit;
a loudspeaker for outputting an acoustic signal representative of the signal obtained from the electrical measurement circuit,
wherein the acoustic processing circuit is configured to receive at least one measurement parameter from the electrical measurement circuit, the at least one measurement parameter comprises a mask violation,
wherein the acoustic processing circuit is configured to modulate a predetermined acoustic signal by the at least one measurement parameter, and
wherein the acoustic processing circuit is configured to modulate at least one of amplitude, frequency, or phase of the predetermined acoustic signal by the at least one measurement parameter,
wherein the modulated predetermined acoustic signal is outputted by the loudspeaker.

10. The oscilloscope according to claim 9, wherein at least one of the amplitude, the frequency, or the phase of the predetermined acoustic signal is modulated by two different measurement parameters derived from the measured electrical signal by the electrical measurement circuit.

11. The oscilloscope according to claim 9, wherein at least one carrier tone of the predetermined acoustic signal is modulated.

12. The oscilloscope according to claim 9, wherein a plurality of carrier tones of the predetermined acoustic signal are modulated.

13. The oscilloscope according to claim 12, wherein each carrier tone is modulated by a different source.

14. The oscilloscope according to claim 9, wherein the acoustic signal is a non-binary acoustic signal.

15. An oscilloscope, comprising:
an interface with which a probe for probing a device under test is connected in order to retrieve an electrical signal;
an electrical measurement circuit for measuring the electrical signal received from the probe and for deriving at least one measurement parameter from the measured electrical signal;
an acoustic processing circuit for processing a signal obtained from the electrical measurement circuit; and
wherein the electrical measurement circuit is connected to the acoustic processing circuit;
a loudspeaker for outputting an acoustic signal representative of the signal obtained from the electrical measurement circuit,
wherein the acoustic processing circuit is configured to receive at least one of the following measurement parameters from the electrical measurement circuit for generating the acoustic signal:
a mask violation, a magnitude of mask violation, a number of mask violations, a histogram, peak to peak of amplitudes, a mean value of amplitudes, a root mean square of amplitudes, a standard deviation of amplitudes, an overshoot, an area, a rise time, a fall time, a positive switching, a negative switching, a cycle root mean square, a cycle standard deviation, a hold time, a hold ration, a pulse train, a slew rate rising, a slew rate falling, an excitation ratio, an eye height, an eye width, an eye top, an eye base, a Q factor, a signal to noise ratio, an eye rise time, an eye fall time, an eye bit rate, an eye amplitude, a jitter, a channel power, a bandwidth, an occupied bandwidth, a harmonic search, a total harmonic distortion, total harmonic distortion variants, overall voltage root mean square, a peak list, a cycle-to-cycle jitter, a N-cycle jitter, a cycle-to-cycle width, a cycle-to-cycle duty cycle, a time-interval error, a unit interval, a skew delay, a skew phase, histogram samples, histogram peak, peak value, maximum of histogram, minimum of histogram, median of histogram, range of histogram, range of histogram, mean of histogram, or root mean square of histogram,
wherein the acoustic processing circuit is further configured to modulate a predetermined acoustic signal by the at least one of the measurement parameters, and
wherein the acoustic processing circuit is further configured to modulate at least one of amplitude, frequency, or phase of the predetermined acoustic signal by the at least one of the measurement parameters,
wherein the modulated predetermined acoustic signal is outputted by the loudspeaker.

* * * * *